United States Patent
Boggs et al.

(10) Patent No.: US 6,787,443 B1
(45) Date of Patent: Sep. 7, 2004

(54) PCB DESIGN AND METHOD FOR PROVIDING VENTED BLIND VIAS

(75) Inventors: David W. Boggs, Hillsboro, OR (US); John H. Dungan, Hillsboro, OR (US); Gary I. Paek, Banks, OR (US); Daryl A. Sato, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/442,834

(22) Filed: May 20, 2003

(51) Int. Cl.⁷ .............................................. H01L 21/44
(52) U.S. Cl. ....................... 438/612; 438/115; 438/613; 438/614; 29/852
(58) Field of Search .................... 257/737, 738; 438/613–617, 115, 612, 108; 29/852; 228/180.22

(56) References Cited

U.S. PATENT DOCUMENTS

| | | | |
|---|---|---|---|
| 4,764,485 A | * 8/1988 | Loughran et al. | 438/690 |
| 5,477,086 A | * 12/1995 | Rostoker et al. | 257/737 |
| 5,558,271 A | * 9/1996 | Rostoker et al. | 228/180.22 |
| 5,600,180 A | * 2/1997 | Kusaka et al. | 257/692 |
| 5,742,094 A | * 4/1998 | Ting | 257/620 |
| 5,842,275 A | * 12/1998 | McMillan et al. | 29/840 |
| 5,875,102 A | * 2/1999 | Barrow | 361/777 |
| 6,245,594 B1 | * 6/2001 | Wu et al. | 438/108 |
| 6,282,782 B1 | * 9/2001 | Biunno et al. | 29/852 |
| 6,392,300 B1 | * 5/2002 | Koike | 257/758 |
| 6,395,995 B1 | 5/2002 | Joy et al. | |
| 6,429,389 B1 | 8/2002 | Chung et al. | |
| 6,580,174 B2 | 6/2003 | McCormick et al. | |
| 6,593,220 B1 | * 7/2003 | Yu et al. | 438/612 |
| 6,631,558 B2 | * 10/2003 | Burgess | 29/852 |
| 2002/0084312 A1 | * 7/2002 | Shier et al. | 228/180.22 |
| 2003/0064546 A1 | 4/2003 | McCormick et al. | |

* cited by examiner

Primary Examiner—Kamand Cuneo
Assistant Examiner—Thanh Y. Tran
(74) Attorney, Agent, or Firm—Blakely, Sokoloff, Taylor & Zafman LLP

(57) ABSTRACT

An apparatus and method for providing a vented blind via in pad of a printed circuit board (PCB). A vent in the blind via in pad to allow gases formed during reflow soldering to escape from the solder joint. In one embodiment, the vent extends from the outer edge of the pad to the blind via. In another embodiment, a method includes forming a blind via in pad having a vent.

6 Claims, 12 Drawing Sheets

FIG. 1A
(PRIOR ART)
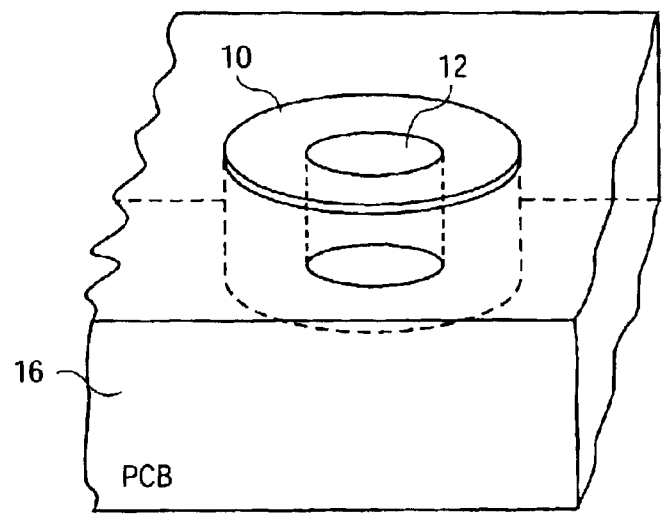
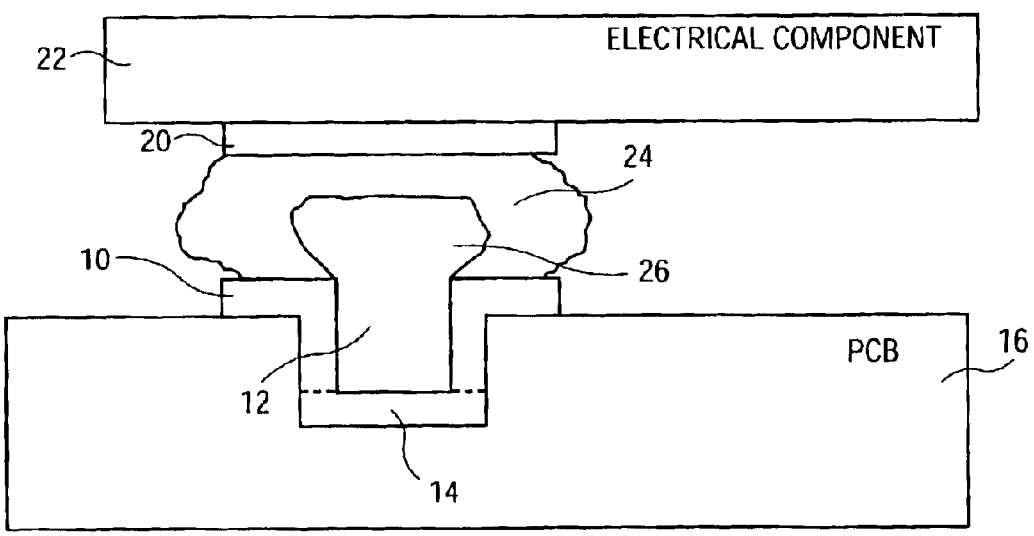
FIG. 1B
(PRIOR ART)

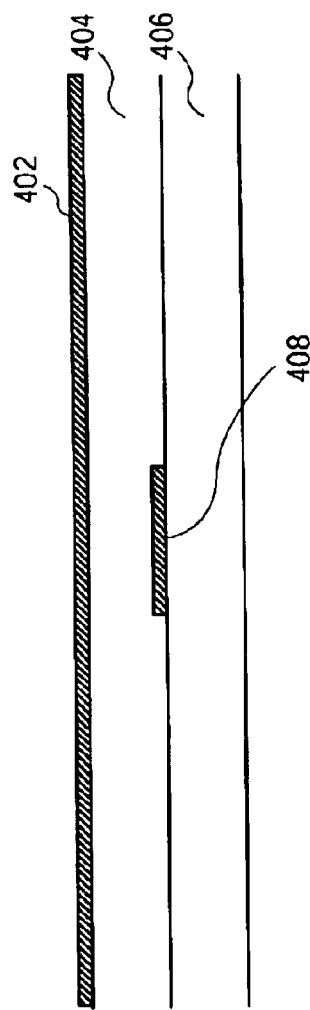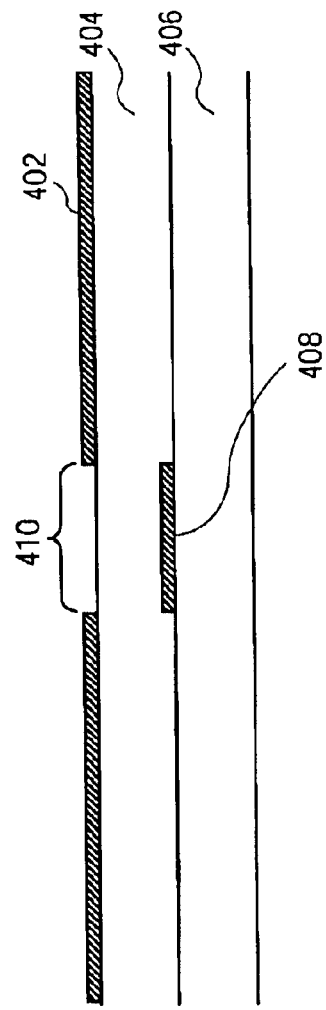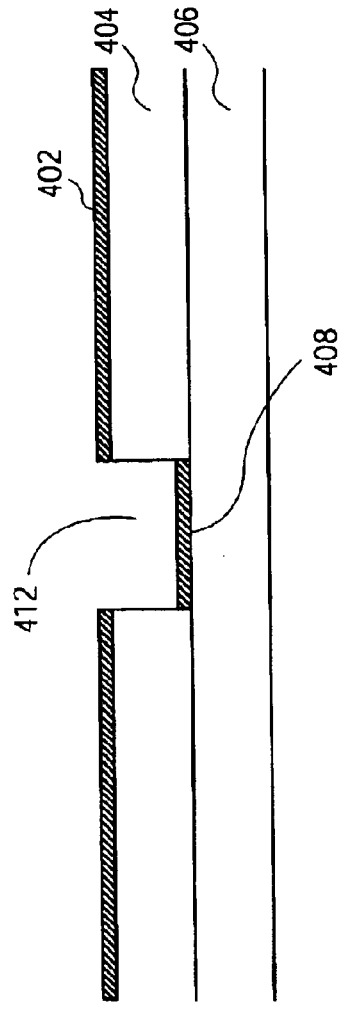

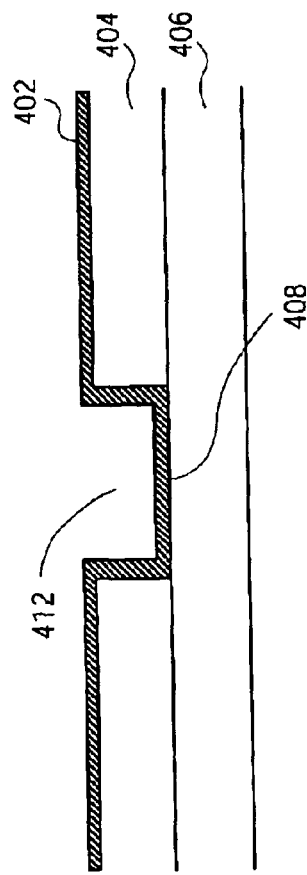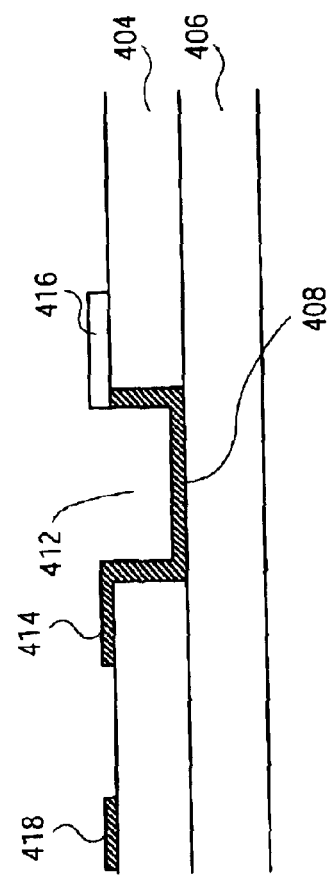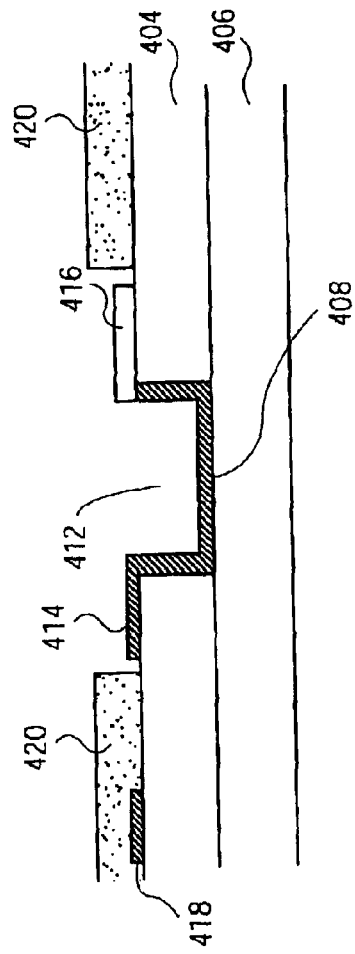

PCB DESIGN AND METHOD FOR PROVIDING VENTED BLIND VIAS

BACKGROUND OF THE INVENTION

1. Field of the Invention

The present invention relates generally to printed circuit boards (PCBs) and, more specifically, the present invention relates to a method an apparatus for a vented blind via in pad structure of a printed circuit board.

2. Background Information

A PCB typically includes a number of insulation and metal layers selectively patterned to provide metal interconnect lines (referred to herein as "traces"), and a plurality of electronic components mounted on one or more surfaces of the PCB and functionally interconnected through the traces. The routing traces typically carry signals that are transmitted between the electronic components mounted on the PCB. Some PCBs have multiple layers of routing traces to accommodate all of the interconnections.

Traces located within different layers are typically connected electrically by vias formed in the board. A via can be made by making a hole through some or all layers of a PCB and then coating or plating the interior hole surface with an electrically conductive material. A via that connects all layers of the PCB, including the outer layers, is called a "through via." A via that connects one or more inner layers to an outer layer is a "blind via."

In order to fabricate PCBs in which electrical components are mounted in higher densities, a via in pad structure is often used. FIG. 1A is a perspective view diagram illustrating a prior art blind via in pad. A blind via 12 is configured in pad 10. The pad is formed on a multilayer PCB 16. Blind via 12 has an opening at pad 10 and extends into PCB 16. The walls of the blind via 12 are an electrically conductive material, such as copper. A solder mask (not shown) surrounds the pad 10.

One of the conventional ways of mounting electrical components on a PCB is called surface mount technology (SMT). SMT components have terminations or leads (generally referred to as "contacts") that are soldered directly to the surface of the PCB. The solder joint forms the physical and electrical connection between the component and the PCB. One conventional type of SMT component utilizes a ball grid array (BGA) to connect to the PCB. A BGA component has a plurality of solder balls on one surface, each of which represents an electrical contact.

The electrical contacts of an SMT component, such as a BGA component, are coupled to corresponding metallized mounting or bonding pads (also referred to as "lands") on the surface of the PCB. Ordinarily one pad is dedicated to one SMT electrical contact.

Prior to mounting the SMT component on a PCB, the PCB is selectively coated with solder paste, using a mask (also referred to in the art as a stencil) that permits solder paste to coat just the pads. To mount an SMT component to a PCB, the component is carefully positioned or "registered" over the PCB so that its electrical contacts are aligned with the corresponding pads. Finally, the entire package is heated to a temperature that melts the solder paste (e.g., reflow soldering), to form a solder joint that is an electrical and physical connection.

During the heating process, one or more gas pockets can form within the soldier joint. Such gas pockets can be formed by expanding air bubbles trapped within the solder paste and/or blind via (also referred to as "outgassing"). FIG. 1B is a cross-sectional view diagram illustrating a prior art blind via in pad structure coupled to an electrical component. Blind via 12 is configured in pad 10. The blind via 12 extends into multilayer PCB 16 and is electrically coupled to an inner conductive layer 14. During the heating process to affix contact 20 of electrical component 22 to pad 10 by way of solder joint 24, a gas pocket 26 was formed by trapped air within the blind via 12. A solder mask (not shown) surrounds the pad 10.

Such a gas pocket can cause the solder joint to expand to the point where it touches an adjacent solder joint and, thus, create a short circuit. In the case of BGA components, this phenomenon is referred to as "BGA bridging." The gas pocket may also cause the solder joint to crack and break resulting in an open circuit between the electrical component and the PCB. Additionally, a solder joint with a gas pocket may experience long term reliability issues due to repeated heating and cooling during its operative life.

BRIEF DESCRIPTION OF THE DRAWINGS

The present invention is illustrated by way of example and not limitation in the accompanying figures.

FIGS. 1A and 1B are diagrams illustrating a prior art blind via in pad structure.

FIGS. 4A–4H are cross-sectional diagrams illustrating one embodiment of constructing a vented blind via in pad structure in accordance with the teachings of the present invention.

DETAILED DESCRIPTION

Methods and apparatuses for a providing a vented blind via in pad structure for a PCB are disclosed. In the following description numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. In addition, it is appreciated that the figures provided herewith are for explanation purposes to persons ordinarily skilled in the art and that the drawings are not necessarily drawn to scale.

Figure 2A:
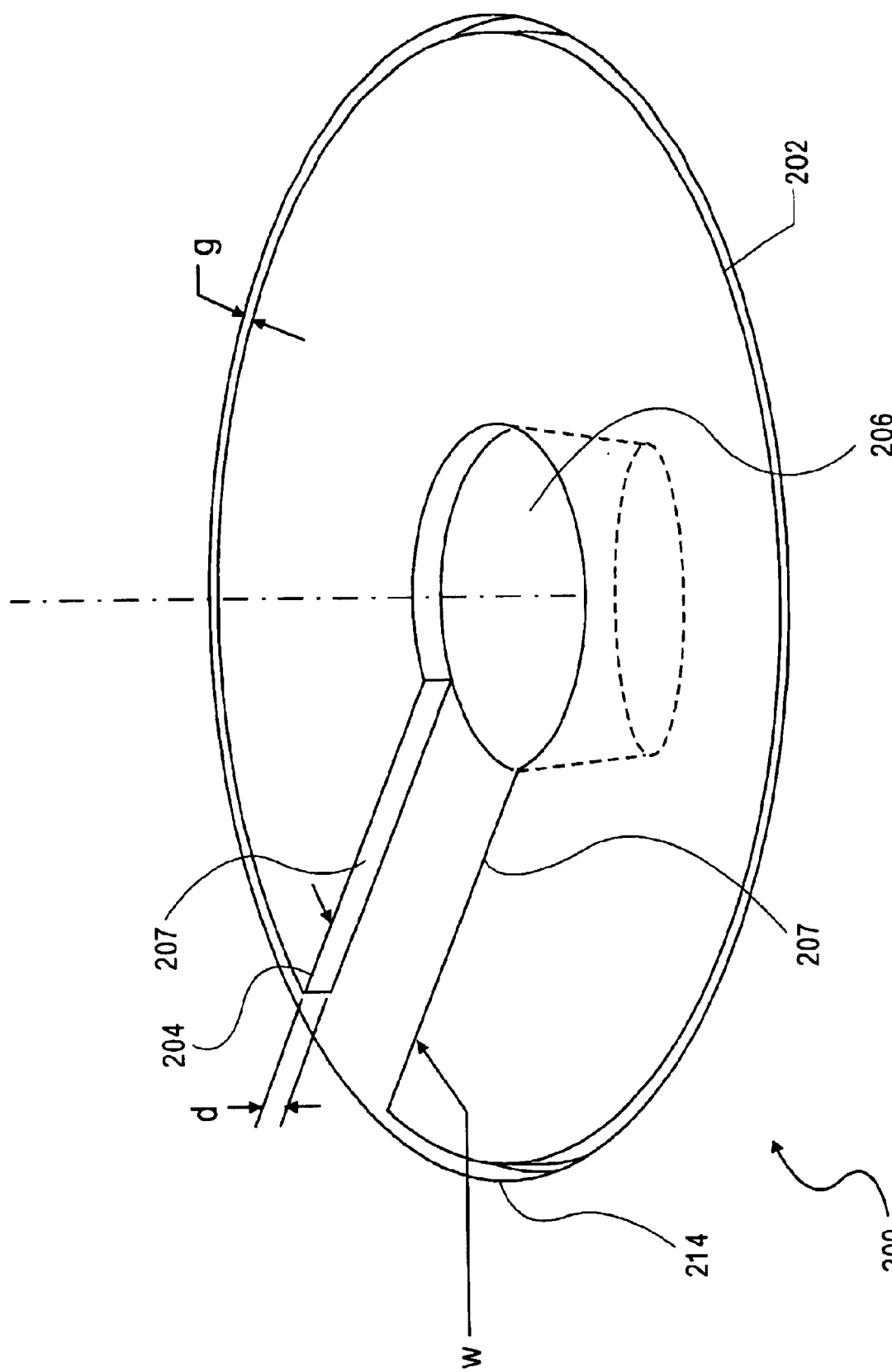
FIG. 2A is a perspective view diagram illustrating one embodiment of a vented blind via in pad in accordance with the teachings of the present invention.
Figure 2B:
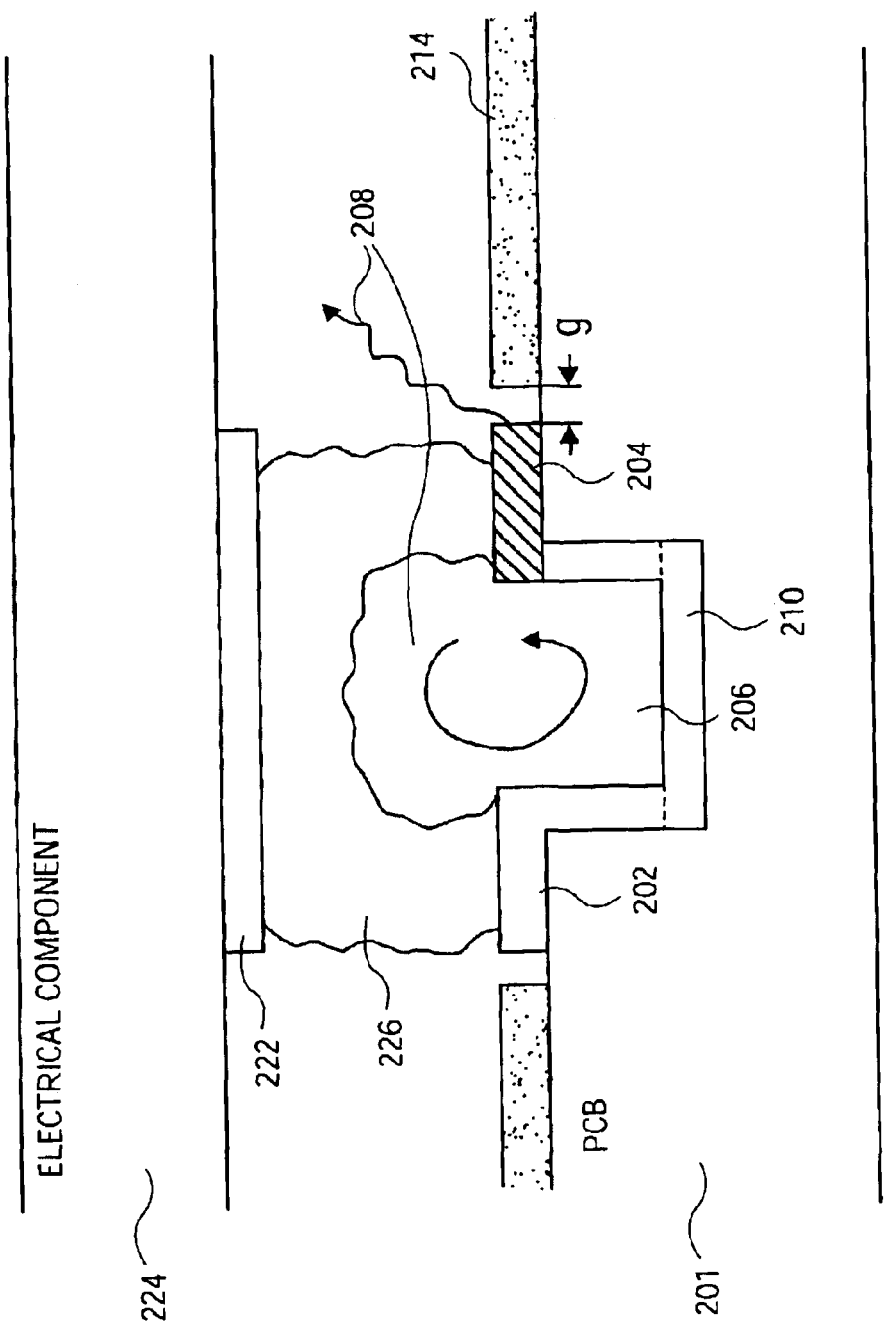
FIG. 2B is a cross-sectional view diagram illustrating one embodiment of a vented blind via in pad in accordance with the teachings of the present invention.

FIGS. 2A and 2B illustrate one embodiment of a blind via in pad 200 having a vent. Referring to FIGS. 2A and 2B, a pad 202 is positioned on a PCB 201. The PCB 201 is a multilayer PCB having a plurality of substrate layers and one or more inner conductive layers.

A blind via 206 is positioned in pad 202. The blind via 206 includes walls of conductive material. The blind via 206 is electrically connected to an inner conductive layer 210, such as, for example, a routing trace. The combination of blind via 206 in pad 202 is typically called a via in pad (or a "microvia"), and is well known in the art.

Surrounding the pad 202 is a solder mask 214. A contact 222 of electrical component 224 is positioned over pad 202. In one embodiment, contact 222 includes a solder ball of a BGA. The electrical component 224 may be, but is not limited to, a microprocessor, a microcontroller, an application specific integrated circuit (ASIC), an amplifier, a filter, a clock circuit, or the like. The conductive material of pad 202, blind via 206, contact 222, and inner conductive layer 210 may be, but is not limited to, copper, aluminum, gold, or the like. While FIG. 2B shows an electrical component attached to one outer layer of PCB 201, in another embodiment, electrical components can be attached to additional outer layers of PCB 201.

It will be appreciated that blind via 206 extends partially into PCB 201. Generally, a blind via is a via that electrically couples one or more inner layers to an outer layer of a multilayer PCB. Note that blind via 206 is not a through-hole via utilizing a via cap or via plug. A via that connects all layers of a PCB, including the outer layers, is called a "through via" or a "plated through hole via" (PTH).

A vent 204 is positioned in pad 202. In one embodiment, the vent 204 can have approximately parallel walls 207 to form a groove shape. In one embodiment, the vent 204 is sized to permit nearly all of a gas 208 to escape to the atmosphere. In another embodiment, the approximately parallel vent walls 207 are sized to a width (w) to meter escape of the gas 208 such that some gas 208 remains in the blind via 206. In one embodiment, the depth (d) of vent 204 reaches the outer substrate layer of PCB 201; while in another embodiment, the depth of vent 204 does not reach the outer substrate layer of PCB 201 (discussed further in conjunction with FIGS. 6A and 6B.) In the embodiment shown in FIGS. 2A and 2B, the vent 204 runs from the outer edge of pad 202 to blind via 206.

A gap placed at the outer edge of the pad 202 allows clearance for gas 208 to escape the vent 204. In one embodiment shown in FIGS. 2A and 2B, surrounding the pad 202 is the solder mask 214 where a gap (g) is between the solder mask 214 and the outer edge of pad 202. Solder will not adhere to the outer layer of substrate of PCB 201 or to solder mask 214. As a result, the venting path (vent 204 plus gap g between pad 202 and solder mask 214) will not become filled or clogged with solder during a solder reflow process. In an alternative embodiment, a gap is placed at the outlet of the vent 204 between the solder mask 214 and the outer edge of pad 202. Such a gap is does not surround the entire pad 202. For example, the gap may be approximately the same width as the width (w) of the vent 204.

In a typical solder reflow process, solder paste is applied to pad 202. The entire assembly is heated to a temperature that melts the solder paste (and solder balls of a BGA) so that the pad 202 and contact 222 form a physical and electrical connection via a solder joint 226.

During solder reflow, gas 208 can form in the solder joint 226 and/or blind via 206. The expanding gas 208 will seek a path of less resistance and travel into the vent 204. By incorporating a vent 204 within the pad 202, a pathway is established that allows the expanding gas 208 to escape the solder joint 226 while the solder (and solder ball) is in the molten state. All or a portion of the expanding gas 208 that otherwise would contribute to expanding the solder joint 226 may now escape to atmosphere through vent 204.

Figure 3A:
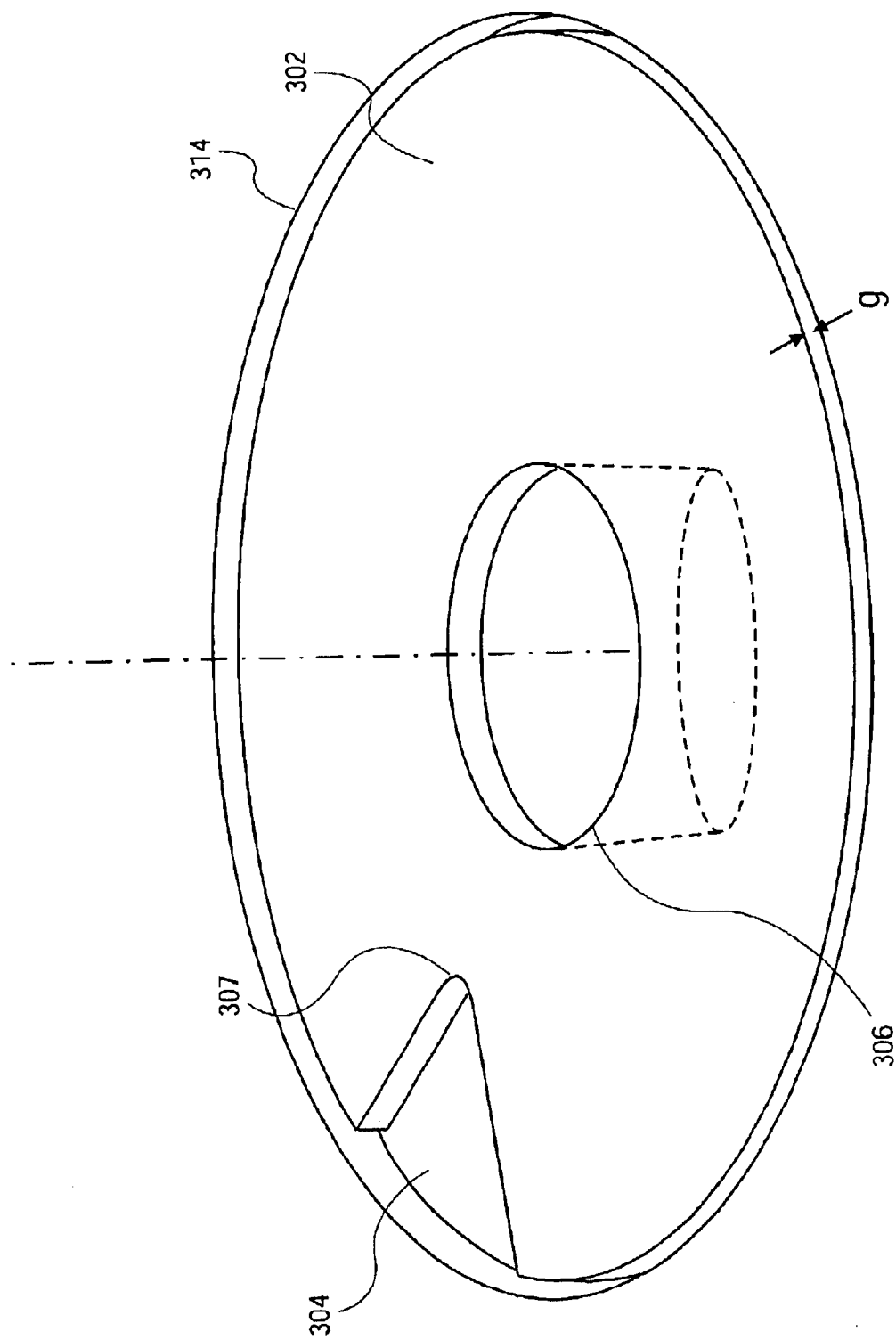
FIG. 3A is a perspective view diagram illustrating one embodiment of a vented blind via in pad in accordance with the teachings of the present invention.
Figure 3B:
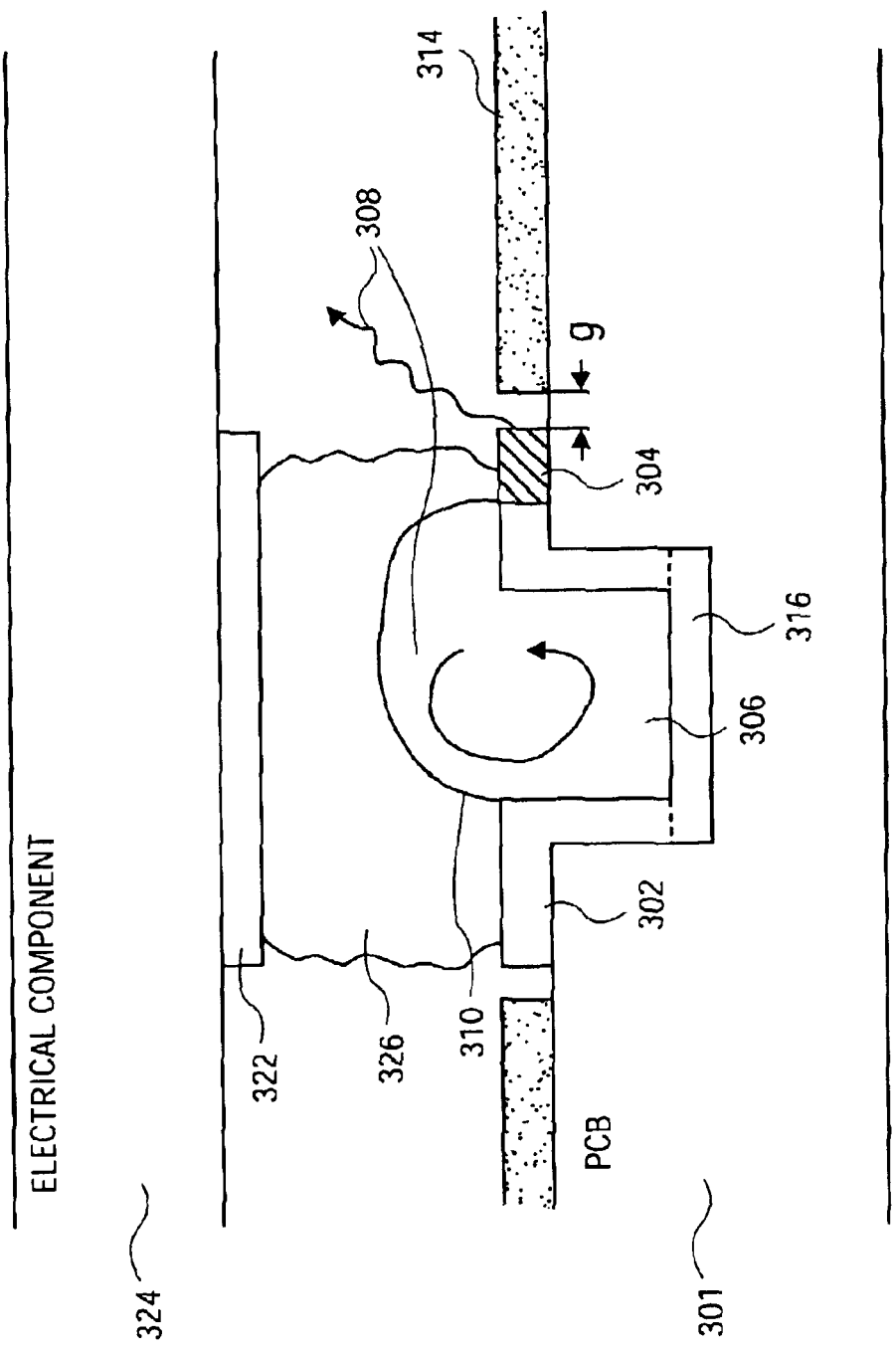
FIG. 3B is a cross-sectional view diagram illustrating one embodiment of a vented blind via in pad in accordance with the teachings of the present invention.

FIGS. 3A and 3B illustrate another embodiment of a vented blind via in pad. Referring to FIGS. 3A and 3B, a pad 302 is positioned on a multilayer PCB 301. A blind via 306 is configured in pad 302. The blind via 306 includes walls of conductive material and is electrically connected to an inner conductive layer 316. Surrounding the pad 302 is a solder mask 314. A contact 322 of an electrical component 324 is positioned over pad 302.

Within the pad 302, a vent 304 does not run continuously from the outer edge of the pad 302 to the blind via 306. In this embodiment, the vent 304 can be roughly shaped like a wedge having an apex 307. With this wedge shaped vent 304, a solder joint 326 can begin to expand due to gas 308 building up within the solder joint 326 with no venting. As the gas 308 builds up in the solder joint 326 and the solder joint 326 continues to expand, a void 310 crosses over and contacts the wedge shaped vent 304 at the vent apex 307. Once contact by the void 310 with the vent 304 occurs, gas 308 can begin to release or vent to atmosphere (or a lower pressure space). With sufficient pressure released, the void 310 can shrink until the void 310 is no longer positioned over the vent 304 or the void 310 is positioned over a smaller cross-section of the vent 304. With venting stopped or slowed, pressure could again build up, again increasing the size of the solder joint 326 to a point where the vent 304 would once more begin to release pressure. This "burping" action could repeat as long as outgassing with the solder joint 326 was being generated with sufficient pressure.

In another embodiment, the release of gas occurs without the burping action. The solder joint 326 could expand to a point on the vent 304 where gas 308 builds up in solder joint 326 verses the rate of gas 308 escaping from vent 304 is such that the rate of expansion of the solder joint 326 would slow or cease. Once the heating process was complete and the assembly began to cool, the outgassing from solder joint 326 would ultimately cease.

The embodiment in FIGS. 3A and 3B show a gap (g) surrounding the pad 302 between the solder mask 314 and the outer edge of pad 302 to create a clearance for gas to escape the vent 304. In another embodiment, the gap (g) does not surround the entire pad 302. For example, the gap may be approximately the same width as the outlet of vent 304 at the outer edge of pad 302.

Figure 4G:
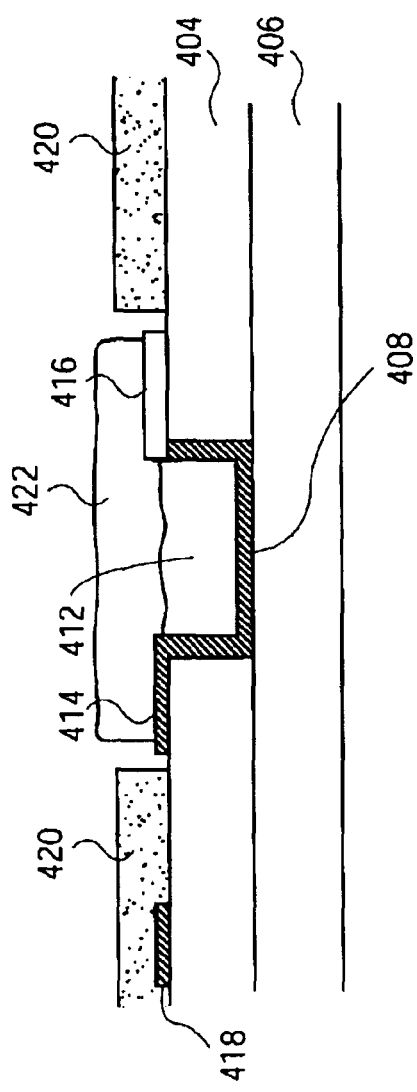

FIGS. 4A–4H illustrate one embodiment of a method to fabricate a vent within a blind via in pad on a multilayer PCB. FIG. 4A is an illustration of an outer conductive layer 402 that has been laminated to substrate 404. Substrate 404 is laminated to substrate 406. Inner conductive layer 408 includes a circuitry trace pattern. The material of conductive layers 402 and 408 may include, but is not limited to, copper, aluminum, gold, or the like. It will be appreciated that the PCB of FIGS. 4A–4H is not limited to the embodiments as shown and may contain additional layers. A blind via may electrically couple one or more of these additional layers.

FIG. 4B is an illustration of the results of creating a window 410 in the outer conductive layer 402. In one embodiment, the window 410 may be created through various photolithography processes that are well known in the art. In another embodiment, the window 410 can be created through a laser skive process of outer conductive layer 402 that is well known in the art. During laser skiving of outer conductive layer 402, a vent 416 (shown in FIGS. 4E–4H) can also be created at this time through laser skiving (described further below).

FIG. 4C is an illustration of the results of laser drilling a blind via 412. The laser ablates the substrate 404 to expose the inner conductive layer 408. FIG. 4D is an illustration of the results of a plating process.

The walls of blind via 412 are plated with conductive material to allow layer-to-layer electrical conductivity between the layers of the PCB.

FIG. 4E is an illustration of the results of trace formation in the outer conductive layer 402. In one embodiment, a pad 414, a vent 416 and a trace 418 is formed through photolithography. If the vent 416 is formed here through photolithography, then the depth of the vent is to the substrate 404.

If the vent 416 was formed by laser skiving as described in conjunction with FIG. 4B, then the vent is not formed here by photolithography. The vent formed by laser skiving is positioned in the outer conductive layer 402 such that the photolithography process creates the pad 414 with the knowledge of the placement of the vent 416 by laser skiving. In one embodiment, a vent formed by laser skiving will not pass entirely through the depth of the pad 414.

FIG. 4F is an illustration of the results of adding a solder mask 420 to the remaining outer conductive layer 402 and substrate 404. Typically, the solder mask 420 covers all exposed features except for the pad 414 (including vent 416 of pad 414). FIG. 4G is an illustration of the results of applying solder 422 to the exposed pad 414.

Figure 4H:
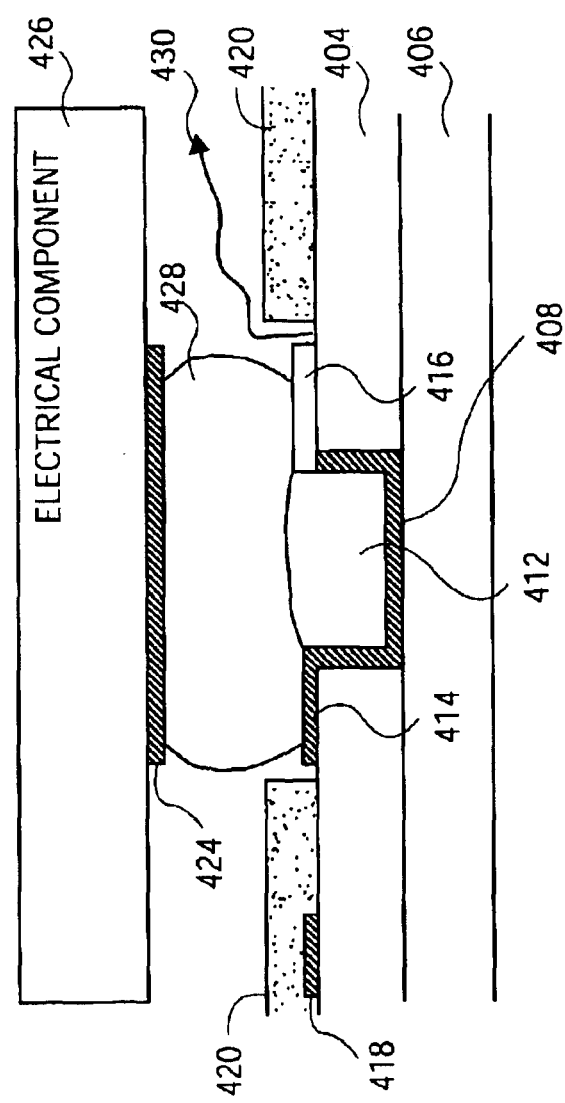

FIG. 4H is an illustration of the results of reflow soldering to couple a contact 424 of an electrical component 426 to pad 414. Electrical component 426 was positioned so that contact 424 was aligned with pad 414. The contact 424 was affixed to pad 414 through reflow soldering, which is well known in the art. During the reflow soldering, a gas 430 that developed in the solder joint 428 or blind via 412 could escape to atmosphere through vent 416.

Figure 5A:
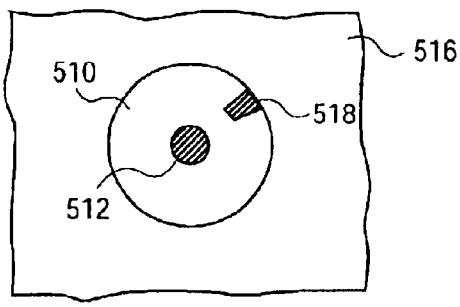
FIGS. 5A–5I are top view diagrams illustrating embodiments of vented blind via in pad structures in accordance with the teachings of the present invention.

FIGS. 5A–5I are top view illustrations of alternative embodiments of vent design. FIG. 5A is a top view diagram illustrating one embodiment of the present invention. A pad 510 is formed on a substrate 516. A blind via 512 is configured in pad 510. Vent 518 extends from the outer edge of pad 510 towards the blind via 512, but does not reaching the opening of blind via 512. The vent 518 has generally a groove shape.

Figure 5B:
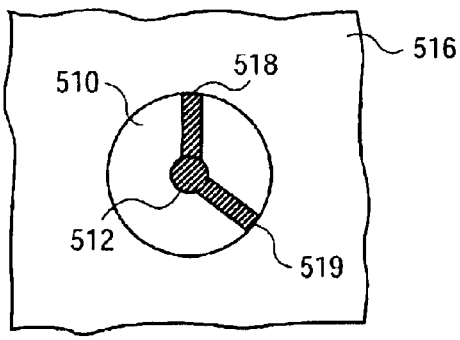
Figure 5C:
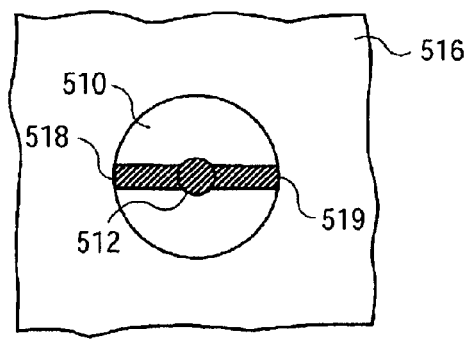

FIGS. 5B and 5C are top view diagrams illustrating embodiments of the present invention. In FIGS. 5B and 5C, a pad 510 is formed on substrate 516. A blind via 512 is configured in pad 510. Vents 518 and 519 are formed in pad 510. Vents 518 and 519 extend from the outer edge of pad 510 to blind via 512. It is understood that the embodiment shown in FIG. 5B is not limited to the angle between vents 518 and 519. FIG. 5C shows vents 518 and 519 such that vents 518 and 519, are collinear along a diameter passing through pad 510.

Figure 5D:
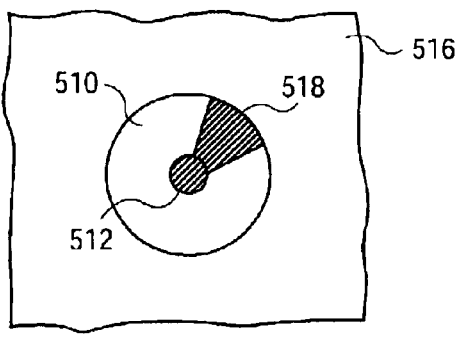
Figure 5E:
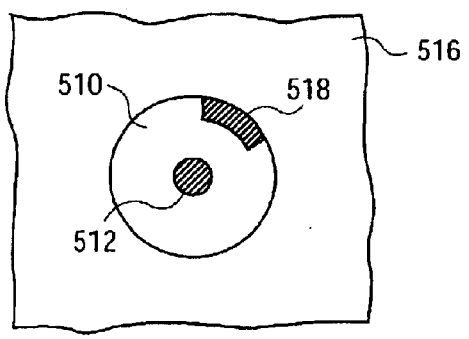

FIGS. 5D and 5E are top view diagrams illustrating embodiments of the present invention. In FIGS. 5D and 5E, a pad 510 is formed on substrate 516. A blind via 512 is configured in pad 510. In the embodiment shown in FIG. 5D, a vent 518 is positioned in pad 510 extending from the outer edge of pad 510 to the blind via 512. The vent 518 has generally a wedge shape. In the embodiment of FIG. 5E, the vent 518 has a half-wedge shape with the apex of the wedge removed. In the embodiment of FIG. 5E, the vent 518 does not reach blind via 512 from the outer edge of pad 510.

Figure 5F:
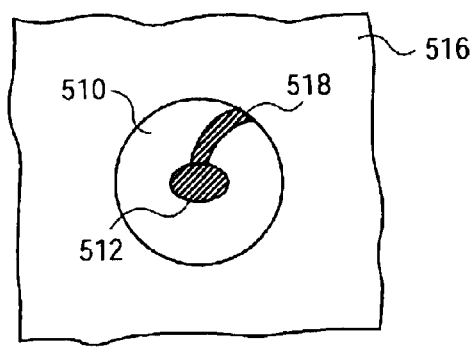
Figure 5G:
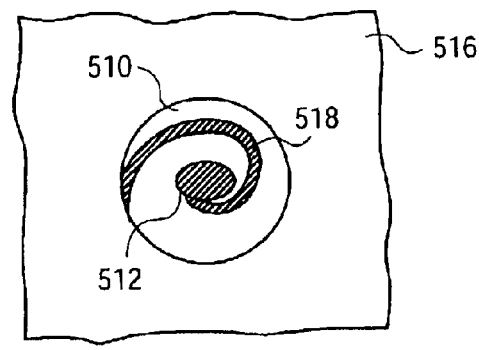

FIGS. 5F and 5G are top view diagrams illustrating embodiments of the present invention. In FIGS. 5F and 5G, a pad 510 is formed on substrate 516. A blind via 512 is configured in pad 510. A vent 518 in pad 510 extends from the outer edge of pad 510 to blind via 512. In the embodiment of FIG. 5F, the path of vent 518 has generally a round shape. In another embodiment (not shown), the path of vent 518 in FIG. 5F has one or more angles to form a zigzag shape. In the embodiment of FIG. 5G, the path of vent 518 has generally a spiral shape.

Figure 5H:
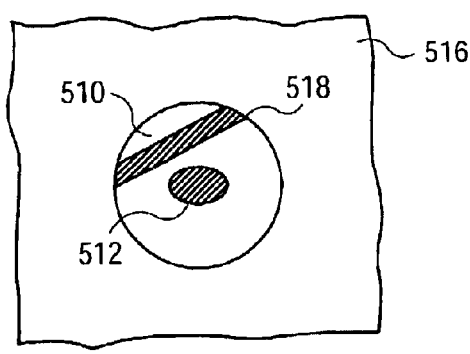
Figure 5I:
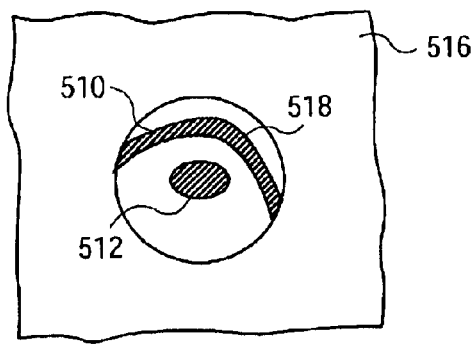

FIGS. 5H and 5I are top view diagrams illustrating embodiments of the present invention. In FIGS. 5H and 5I, a pad 510 is formed on substrate 516. A blind via 512 is configured in pad 510. A vent 518 is in pad 510 extending from a first point on the outer edge of pad 510 to a second point on the outer edge of pad 510, and not intersecting the blind via 512. In the embodiment of FIG. 5H, the path of vent 518 has generally a straight path. In the embodiment of FIG. 5I, the path of vent 118 has generally a curved path. In another embodiment (not shown), the path of vent 518 in FIG. 5I has one or more angles to form a zigzag shape.

Figure 6A:
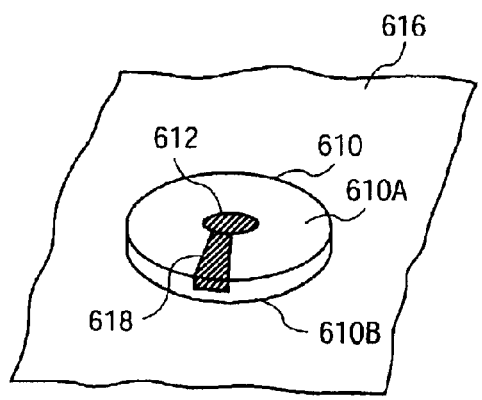
FIGS. 6A and 6B are perspective view diagrams illustrating embodiments of vented blind via in pad structures in accordance with the teachings of the present invention.
Figure 6B:
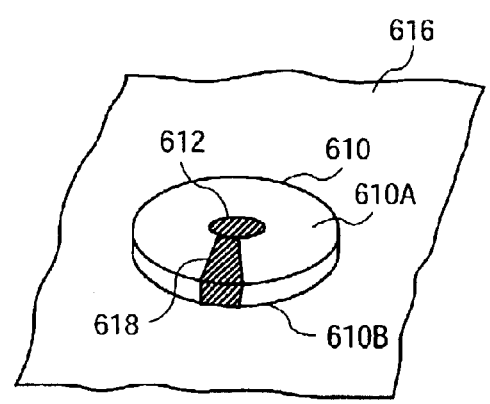

FIGS. 6A and 6B are perspective view illustrations of alternative embodiments of a vent design. In FIGS. 6A and 6B, a pad 610 is formed on a substrate 616. A blind via 612 is configured in pad 610. A vent 618 is in pad 610 extending from the outer edge of pad 610 to the blind via 612. Pad 610 has a first face 610A and a second face 610B, where second face 610B is the face of pad 610 coupled to substrate 616. In the embodiment of FIG. 6A, the vent 618 passes from first face 610A into pad 610, but does not reach second face 610B. The depth of vent 618 does not pass all the way through pad 610. In the embodiment of FIG. 6B, the vent 618 passes from first face 610A to second face 610B. In this embodiment, the depth of vent 618 passes all the way through pad 610 to expose substrate 616.

Figure 7:
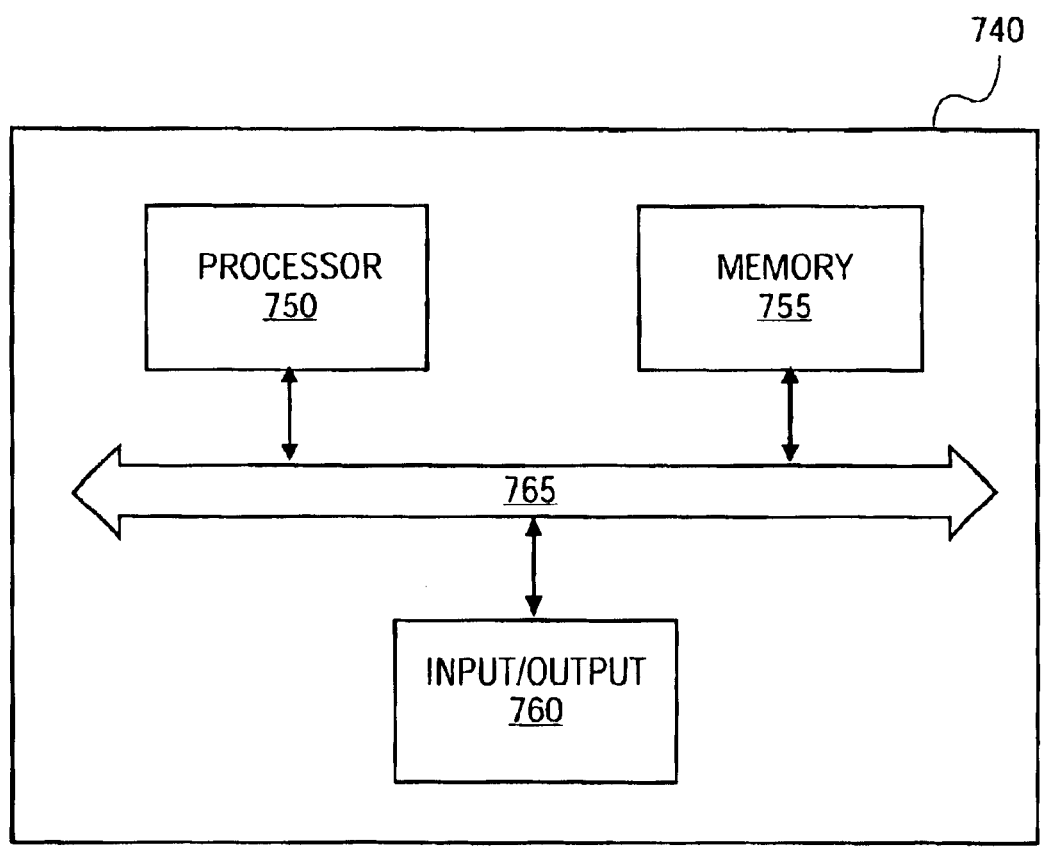
FIG. 7 is a diagram illustrating a computer system for implementing an embodiment of the present invention.

FIG. 7 is an illustration of one embodiment of an example computer system 740 that can be implemented in conjunction with the presently claimed invention. Computer system 740 includes a processor 750, a memory 755, an input/output controller 760. Bus 765 is coupled to each of processor 750, memory 755 and input/output controller 760. Processor 750 may be a conventional microprocessor including, but not limited to, an Intel Corporation x86, Pentium, or Itanium family microprocessor, a Motorola family microprocessor, or the like. Memory 755 includes Dynamic Random Access Memory (bRAM), Static Random Access Memory (SRAM), Synchronized Dynamic Random Access Memory (SDRAM), Rambus Dynamic Random Access Memory (RDRAM), or the like. An input/output device (not shown) coupled to input/output controller 760 may be a keyboard, disk drive, printer, scanner and other input and output devices, including a mouse, trackball, trackpad, joystick, or other pointing device. In computer system 740, any one of the processor 750, memory 755, and input/output controller 760 are coupled to a PCB having at least one vented blind via in pad as described herein.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A method, comprising:

providing a multilayer assembly wherein an outer conductive layer is coupled to a multilayer substrate, the multilayer substrate including at least two layers of substrate and an inner conductive layer;

forming a window into the outer conductive layer;

forming a blind via in the window to expose the inner conductive layer by removing one or more layers of substrate; and forming a blind via in pad in the outer conductive layer, the blind via in pad including a pad formed over the blind via, the pad including a vent to allow gas to escape the blind via in pad.

2. The method of claim 1, wherein forming the blind via in pad includes performing photolithography.

3. The method of claim 1, wherein forming the window in the outer conductive layer includes performing laser skiving.

4. The method of claim 3, further comprising forming the vent through laser skiving.

5. The method of claim 1, further comprising plating the blind via to form a layer-to-layer electrical connection.

6. The method of claim 1, further comprising:

adding a solder mask to the multilayer assembly to cover all exposed features except for the vent and the pad of the blind via in pad;

applying solder to the pad;

positioning an electrical component so that a contact of the electrical component is aligned with the pad; and affixing the contact to the pad.

\* \* \* \* \*

UNITED STATES PATENT AND TRADEMARK OFFICE
CERTIFICATE OF CORRECTION

PATENT NO. : 6,787,443 B1
DATED : September 7, 2004
INVENTOR(S) : Boggs et al.

It is certified that error appears in the above-identified patent and that said Letters Patent is hereby corrected as shown below:

Column 5,
Line 61, delete "SC" and insert -- 5C --.

Column 6,
Line 59, delete "(bRAM)" and insert -- (DRAM) --.

Signed and Sealed this

Thirty-first Day of May, 2005

JON W. DUDAS
*Director of the United States Patent and Trademark Office*